United States Patent
Mori et al.

(10) Patent No.: US 7,564,008 B2
(45) Date of Patent: Jul. 21, 2009

(54) ALUMINA MEMBER AND MANUFACTURING METHOD THEREOF

(75) Inventors: Yutaka Mori, Nagoya (JP); Hiroto Matsuda, Ogaki (JP); Kazuhiro Nobori, Handa (JP)

(73) Assignee: NGK Insulators, Ltd., Nagoya-shi (JP)

( * ) Notice: Subject to any disclaimer, the term of this patent is extended or adjusted under 35 U.S.C. 154(b) by 572 days.

(21) Appl. No.: 11/295,150

(22) Filed: Dec. 6, 2005

(65) Prior Publication Data

US 2006/0169688 A1 Aug. 3, 2006

(30) Foreign Application Priority Data

Dec. 14, 2004 (JP) ............... P2004-361882
Sep. 5, 2005 (JP) ............... P2005-256484

(51) Int. Cl.
*H05B 3/68* (2006.01)
*C23C 16/00* (2006.01)

(52) U.S. Cl. ................... 219/444.1; 118/724

(58) Field of Classification Search ........... 219/444.1, 219/541–548; 118/724, 725; 339/306–314
See application file for complete search history.

(56) References Cited

U.S. PATENT DOCUMENTS

| | | | |
|---|---|---|---|
| 5,306,895 A | 4/1994 | Ushikoshi et al. | |
| 5,424,257 A * | 6/1995 | Schat et al. | 501/127 |
| 5,683,606 A * | 11/1997 | Ushikoshi et al. | 219/544 |
| 5,701,228 A | 12/1997 | Ishii | |
| 5,968,379 A | 10/1999 | Zhao et al. | |
| 6,617,514 B1 | 9/2003 | Ushikoshi et al. | |
| 2003/0075537 A1* | 4/2003 | Okajima et al. | 219/444.1 |
| 2003/0170415 A1* | 9/2003 | Hiramatsu et al. | 428/64.1 |

FOREIGN PATENT DOCUMENTS

| | | |
|---|---|---|
| EP | 0 886 312 A2 | 12/1998 |
| EP | 1 249 433 A1 | 10/2002 |
| GB | 697 306 A1 | 9/1953 |
| JP | 09-008114 | 1/1997 |
| JP | 11-012053 A1 | 1/1999 |
| KR | 1999-006874 | 1/1999 |
| WO | 01/43183 A2 | 6/2001 |

OTHER PUBLICATIONS

Intrater, J., "The Challenge of Bonding Metals to Ceramics," Machine Design, Penton Media, Cleveland, OH, vol. 61, No. 24, Nov. 23, 1989, pp. 95-100.

* cited by examiner

*Primary Examiner*—Sang Y Paik
(74) *Attorney, Agent, or Firm*—Burr & Brown

(57) ABSTRACT

An electrostatic chuck includes a base of a sintered body containing alumina, an electrode as a power-supplied member embedded in the base and supplied with electric power, a bonding member embedded in the base and bonded to the electrode, in which a difference in coefficient of thermal expansion from the sintered body is $2\times10^{-6}$/K or less, and a melting point is higher than baking temperature of the sintered body, and a terminal bonded to the electrode through the bonding member.

7 Claims, 4 Drawing Sheets

ALUMINA MEMBER AND MANUFACTURING METHOD THEREOF

CROSS REFERENCE TO RELATED APPLICATIONS

This application is based upon and claims the benefit of priority from prior Japanese Patent Application No. P2004-361882, filed on Dec. 14, 2004, and No. P2005-256484, filed on Sep. 5, 2005; the entire contents of which are incorporated herein by reference.

BACKGROUND OF THE INVENTION

1. Field of the Invention

The present invention relates to an alumina member suitable for an electrostatic chuck and a heater and to a manufacturing method thereof.

2. Description of the Related Art

Heretofore, in a semiconductor manufacturing process, there has been used an alumina member, such as an electrostatic chuck in which an electrode is embedded in an alumina sintered body, and a heater in which a resistance heating element is embedded in such an alumina sintered body. To each the electrode and the resistance heating element, a terminal for connecting a power supply line thereto is bonded by brazing or the like. Moreover, in the alumina sintered body, a hole for inserting the terminal thereinto is formed (for example, refer to Japanese Patent Laid-Open Publication No. H11-12053 (published in 1999)).

However, the conventional alumina member has had a subject that the terminal and a power-supplied member to be supplied with electric power, such as the electrode and the resistance heating element, are desired to be bonded to each other more firmly. Moreover, there has been a possibility that the formation of the hole, and so on, may bring a strength reduction of the alumina member. In particular, in the case of a Coulomb-type electrostatic chuck, since thickness of a dielectric layer thereof is thin, there has been a possibility that the strength reduction may be brought.

SUMMARY OF THE INVENTION

In this connection, it is an object of the present invention to provide a strong alumina member in which a power-supplied member and a terminal are firmly bonded to each other, and to provide a manufacturing method thereof.

An alumina member according to the present invention includes: a base of a sintered body containing alumina; a power-supplied member embedded in the base and supplied with electric power; a bonding member embedded in the base and bonded to the power-supplied member, in which a difference in coefficient of thermal expansion from the sintered body is $2\times10^{-6}$/K or less, and a melting point is higher than baking temperature of the sintered body; and a terminal bonded to the power-supplied member through the bonding member.

According to the alumina member as described above, the power-supplied member and the terminal are firmly bonded to each other. Moreover, the base of the sintered body containing alumina and the bonding member are approximate to each other in coefficient of thermal expansion. Accordingly, a crack which may be caused by embedding the bonding member in the base can be prevented from occurring. Therefore, strength of the alumina member can be enhanced by embedding the bonding member therein, and the crack which may be caused by the embedding can also be prevented from occurring. Hence, the strength of the alumina member can be enhanced. In addition, the melting point of the bonding member is higher than the baking temperature of the sintered body, and accordingly, in a manufacturing process of the alumina member, the bonding member can be prevented from being deformed, and a component of the bonding member can be prevented from being diffused into the base. Hence, a malfunction does not occur owing to the embedding of the bonding member.

It is preferable that the bonding member contain at least either niobium (Nb) or platinum (Pt). According to this, the power-supplied member and the terminal can be bonded to each other more firmly. In addition, the base composed of the sintered body containing alumina and the bonding member can be approximated to each other in coefficient of thermal expansion. Accordingly, the crack of the base can be further prevented from occurring, and the strength of the alumina member can be further enhanced. Moreover, when the bonding member contains platinum, the component of the bonding member can be prevented from being diffused into the base.

It is preferable that at least a part of the sintered body of the base contain 0.05 to 0.5 wt % carbon. According to this, the strength of the base can be enhanced, and the strength of the alumina member can be further enhanced.

It is preferable that the power-supplied member be at least one of either an electrode or a resistance heating element. According to this, the alumina member can be used as an electrostatic chuck in which the electrode is embedded and a heater in which the resistance heating element is embedded.

It is preferable that the bonding member be disc-like or ball-like. According to this, the crack can be further prevented from occurring, and the strength of the alumina member can be further enhanced.

It is preferable that tensile strength of the base at a breaking point thereof be 1.0 kg weight/$mm^2$ or more when a load to pull the base and the terminal in reverse directions is applied thereto. According to this, the power-supplied member and the terminal can be bonded to each other more firmly.

It is preferable that a load (hereinafter, referred to as a "punching load") to the base at the breaking point thereof be 30 kg weight or more when a load is applied thereto in a direction from the terminal toward the bonding member. According to this, strength of the base in the periphery of the power-supplied member and the terminal can be increased, and the strength of the alumina member can be maintained high.

It is preferable that the bonding member and the terminal be bonded to each other by any of indium, gold, silver, an aluminum-alumina composite material, and a gold-nickel alloy. According to this, the bonding member and the terminal are firmly bonded to each other, and the bonding of the power-supplied member and the terminal, which are bonded to each other through the bonding member, can be made firmer.

It is preferable that the power-supplied member and the bonding member be bonded to each other by hot pressing. According to this, the power-supplied member and the bonding member are firmly bonded to each other, and the bonding of the power-supplied member and the terminal, which are bonded to each other through the bonding member, can be made firmer.

A method of manufacturing an alumina member according to the present invention includes the steps of: fabricating a base composed of a sintered body containing alumina, in which a power supplied member and a bonding member bonded to the power-supplied member are embedded, the bonding member having a difference in coefficient of thermal expansion from the sintered body of $2\times10^{-6}$/K or less, and a melting point higher than baking temperature of the sintered body; and bonding a terminal to the bonding member. According to this, a strong alumina member in which the power-supplied member and the terminal are firmly bonded to each other through the bonding member can be provided.

It is preferable that a compact containing alumina, the power-supplied member, and the bonding member be integrally baked by hot pressing. According to this, the power-supplied member and the bonding member can be firmly bonded to each other, and the bonding of the power-supplied member and the terminal, which are bonded to each other through the bonding member, can be made firmer. In addition, in the manufacturing process, the bonding member can be prevented from being deformed, and the component of the bonding member can be prevented from being diffused into the base.

In this case, it is preferable that the compact, the power-supplied member, and the bonding member be baked in a state where carbon is present in the periphery of the bonding member. According to this, the component of the bonding member can be further prevented from being diffused into the base.

For example, at least a part of the compact contains at least one of either carbon powder or a binder serving as a carbon source, thus making it possible to perform the baking in the state where carbon is present in the periphery of the bonding member.

In this case, it is preferable that a content and baking condition of at least one of either the carbon powder or the binder in the compact be adjusted so that carbon contained in at least a part of the sintered body of the base can be 0.05 to 0.5 wt %. According to this, a stronger alumina member can be provided.

Moreover, also by coating the bonding member with carbon or the carbon source, the baking can be performed in the state where carbon is present in the periphery of the bonding member.

According to the present invention, the strong alumina member in which the power-supplied member and the terminal are firmly bonded to each other, and the manufacturing method thereof, can be provided.

DETAILED DESCRIPTION OF THE EMBODIMENTS

Figure 1A:
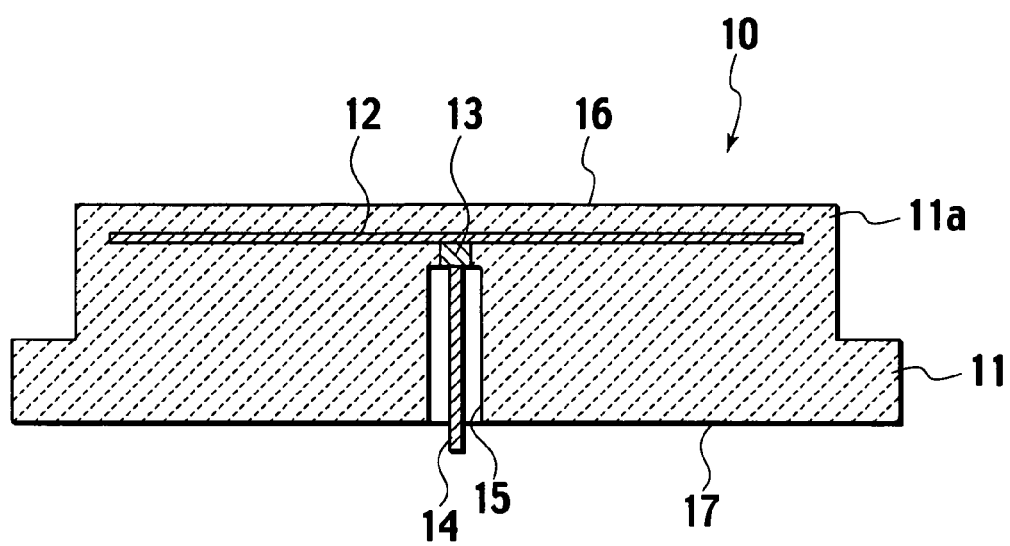
FIG. 1A is a cross-sectional view of an electrostatic chuck according to an embodiment of the present invention, taken along a line IA-IA of FIG. 1B.
Figure 1B:
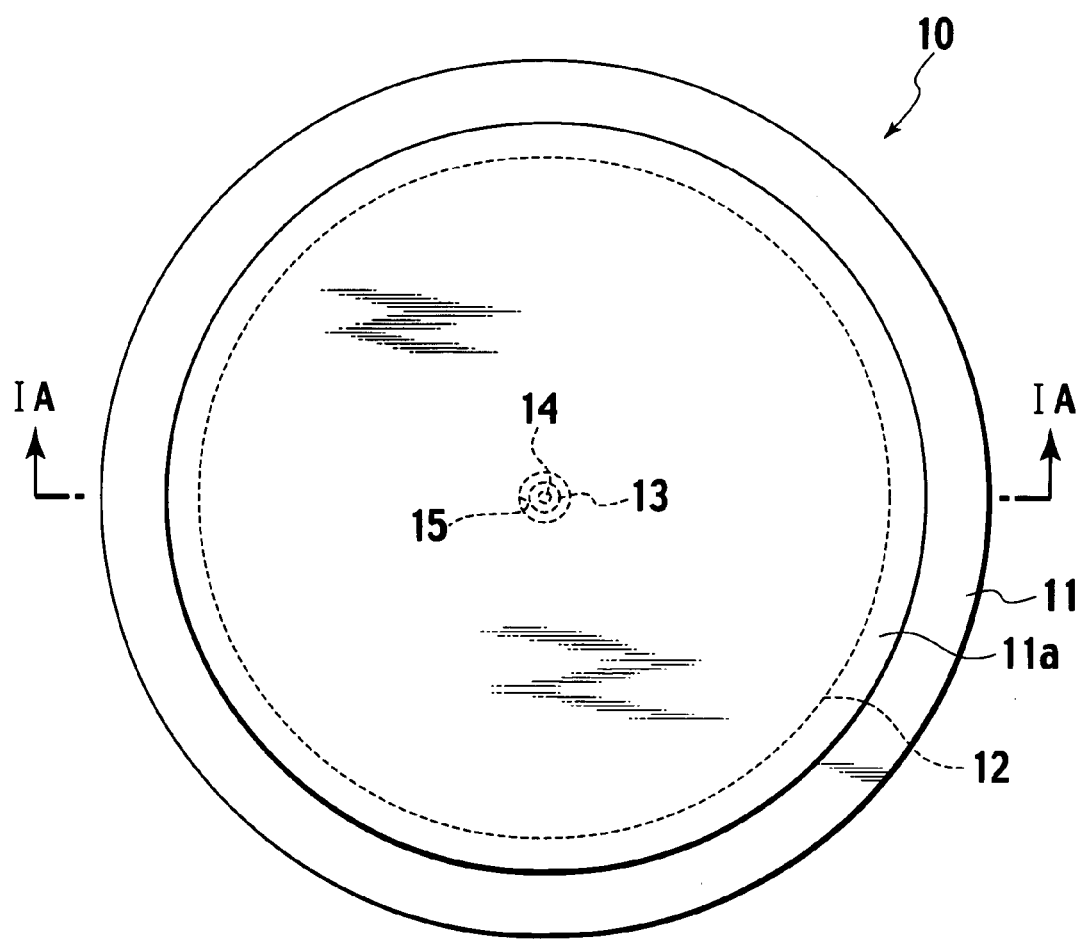
FIG. 1B is a plan view of the electrostatic chuck according to the embodiment of the present invention.

FIG. 1 shows an electrostatic chuck 10 as an alumina member. FIG. 1A is a cross-sectional view of the electrostatic chuck 10, and FIG. 1B is a plan view thereof. The electrostatic chuck 10 includes a base 11, an electrode 12, a bonding member 13, and a terminal 14. The electrostatic chuck 10 is a Coulomb-type electrostatic chuck.

Figure 2A:
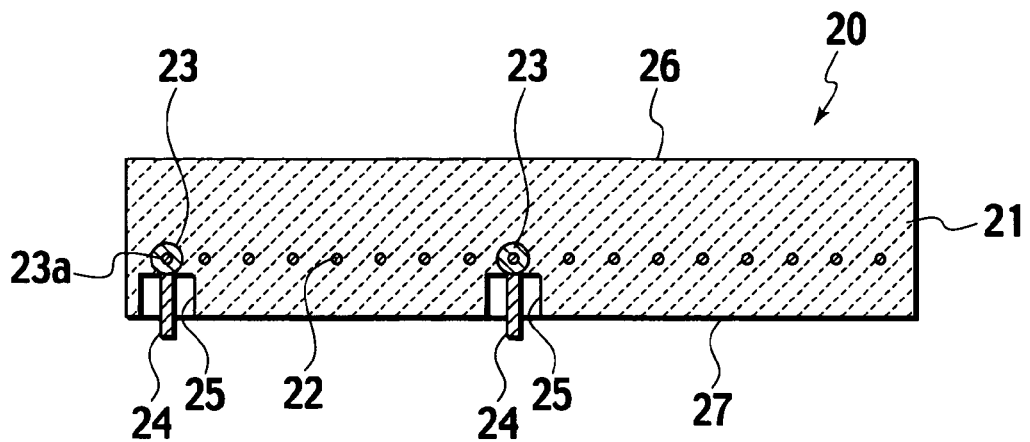
FIG. 2A is a cross-sectional view of a heater according to the embodiment of the present invention, taken along a line IIA-IIA of FIG. 2B.
Figure 2B:
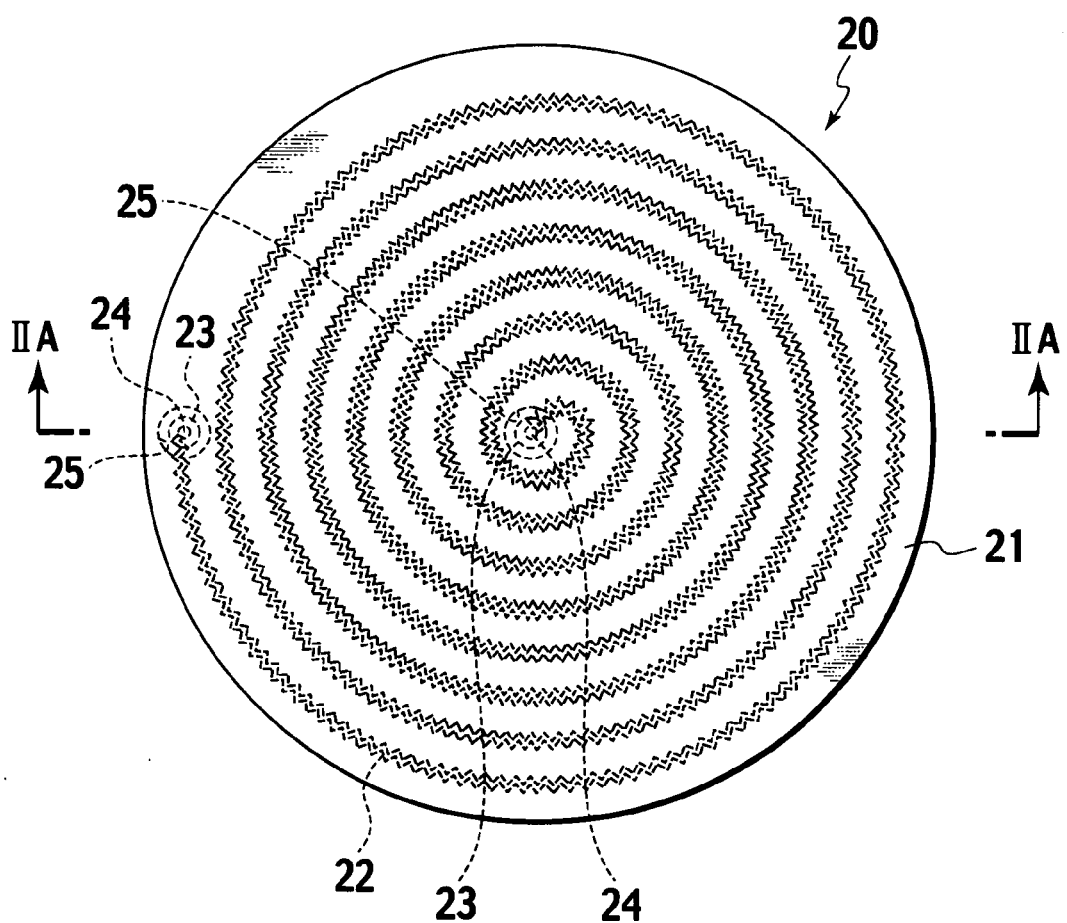
FIG. 2B is a plan view of the heater according to the embodiment of the present invention.

FIG. 2 shows a heater 20 as the alumina member. FIG. 2A is a cross-sectional view of the heater 20, and FIG. 2B is a plan view thereof. The heater 20 includes a base 21, a resistance heating element 22, a bonding member 23, and terminals 24.

Figure 3:
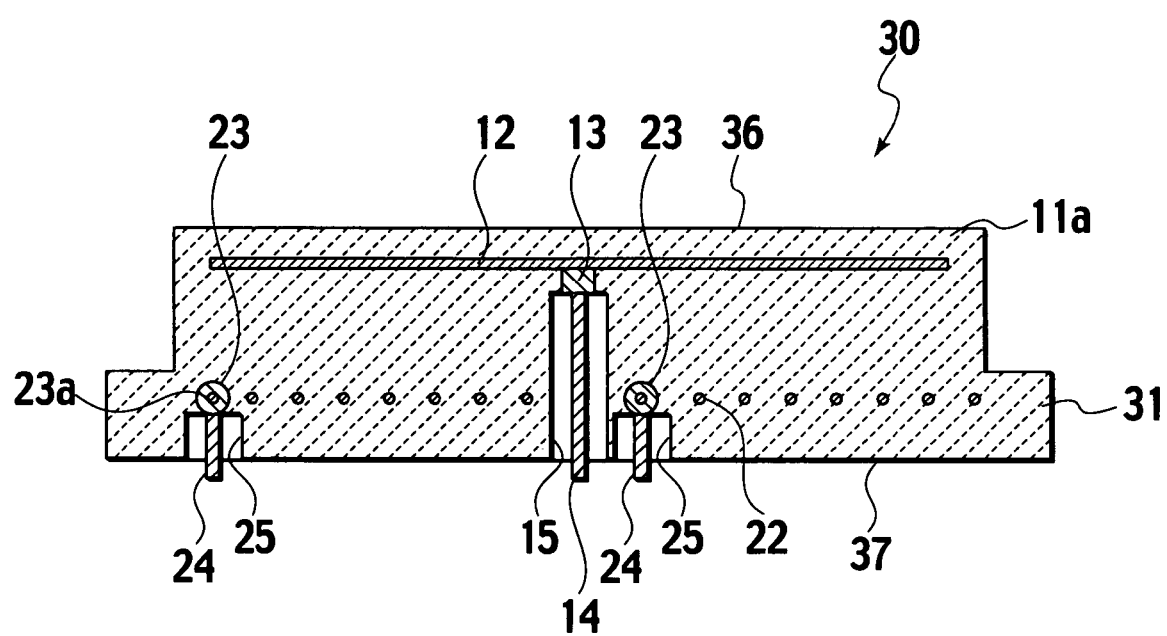
FIG. 3 is a cross-sectional view of an electrostatic chuck subjectable to a heat treatment according to the embodiment of the present invention.

FIG. 3 shows an electrostatic chuck 30 subjectable to a heat treatment, as the alumina member. The electrostatic chuck 30 includes a base 31, an electrode 12, a resistance heating element 22, bonding members 13 and 23, and terminals 14 and 24. The electrostatic chuck 30 combines a function of the electrostatic chuck 10 shown in FIG. 1 and a function of the heater 20 shown in FIG. 2.

The bases 11, 21 and 31 are sintered bodies containing alumina. Each of the bases 11, 21 and 31 can be composed of an alumina sintered body, a sintered body containing alumina and zirconia ($ZrO_2$), a sintered body containing alumina and magnesia (MgO), or the like. It is preferable that each of the bases 11, 21 and 31 be composed of the alumina sintered body.

It is preferable that purity of alumina of the sintered body composing each of the bases 11, 21 and 31 be 99.5 wt % or more. According to this, strength of each of the bases 11, 21 and 31 can be enhanced, and corrosion resistance thereof can also be enhanced. In addition, contamination of a substrate can be prevented. It is more preferable that the purity of alumina of the sintered body composing each of the bases 11, 21 and 31 be 99.7 wt % or more. Although a shape of each of the bases 11, 21 and 31 is not limited, for example, each of the bases 11, 21 and 31 can be formed into a circular or polygonal plate-like body when viewed from the above.

It is preferable that at least a part of the sintered body of each of the bases 11, 21 and 31 contain 0.05 to 0.5 wt % carbon. According to this, the strengths of the bases 11, 21 and 31 can be enhanced, and strengths of the electrostatic chucks 10 and 30 and the heater 20 can be further enhanced.

It is preferable that a density of the sintered body composing each of the bases 11, 21 and 31 be 3.80 to 4.00 g/cm³. According to this, the strength of each of the bases 11, 21 and 31 can be enhanced, and the corrosion resistance thereof can also be enhanced. It is more preferable that the density of the sintered body composing each of the bases 11, 21 and 31 be 3.93 to 4.00 g/cm³.

It is preferable that an open void content of the sintered body composing each of the bases 11, 21 and 31 be 0%. Moreover, it is preferable that the maximum void diameter of the sintered body composing each of the bases 11, 21 and 31 be 100 μm or less. According to these, withstand voltages of the bases 11, 21 and 31 can be made large. Hence, arcing can be prevented from occurring. It is more preferable that the maximum void diameter of the sintered body be 50 μm or less.

Moreover, it is preferable that four-point bending strength (JIS R1601) of the sintered body composing each of the bases 11, 21 and 31 at room temperature be 300 MPa. It is more preferable that the four-point bending strength of the sintered body composing each of the bases 11, 21 and 31 be 350 MPa or more, and it is further preferable that the four-point bending strength be 365 MPa or more. Moreover, when the sintered body composing each of the bases 11, 21 and 31 contains 0.05 to 0.5 wt % carbon, it is preferable that the four-point bending strength of the sintered body composing each of the bases 11, 21 and 31 be 500 MPa or more.

The bases 11, 21 and 31 have substrate mounting surfaces 16, 26 and 36, respectively. On the substrate mounting surfaces 16, 26 and 36, the substrates such as semiconductor wafers and liquid crystal substrates are mounted. It is preferable that a center line average roughness (Ra) (JIS B0601) of each of the substrate mounting surfaces 16, 26 and 36 be 0.5 µm or less. According to this, particles can be prevented from occurring. Moreover, in the case of flowing backside gas between a back surface of the substrate and each of the substrate mounting surfaces 16, 26 and 36, a flow of the backside gas can be prevented from being disturbed, and temperature of the substrate can be maintained even. It is more preferable that the center line average roughness (Ra) of each of the substrate mounting surfaces 16, 26 and 36 be 0.1 to 0.5 µm. According to this, processing cost of the bases 11, 21 and 31 can be reduced.

Moreover, each of the bases 11 and 31 of the electrostatic chucks 10 and 30 includes a dielectric layer 11a. It is preferable that thickness of the dielectric layer 11a be 0.05 to 0.5 mm. According to this, absorbing powers of the electrostatic chucks 10 and 30 can be enhanced. It is more preferable that the thickness of the dielectric layer 11a be 0.05 to 0.4 mm.

It is preferable that a degree of flatness of the dielectric layer 11a, that is, a difference between the maximum value and minimum value of a distance from the electrode 12 to each of the substrate mounting surfaces 16 and 36, be 0.2 mm or less. According to this, even absorbing powers of the electrostatic chucks 10 and 30 can be obtained. It is more preferable that the degree of flatness be 0.1 mm or less.

Moreover, it is preferable that volume resistivity (JIS C2141) of the dielectric layer 11a at room temperature be $1\times10^{15}$ O·cm or more. It is more preferable that the volume resistivity of the dielectric layer 11a be $1\times10^{16}$ O·cm or more. It is further preferable that the volume resistivity of the dielectric layer 11a be $1\times10^{17}$ O·cm or more. According to these, high absorbing power of each of the electrostatic chucks 10 and 30 and good responsiveness thereof to attaching/detaching of the substrate can be obtained.

Furthermore, when at least a part of the sintered body of each of the bases 11 and 31 contains carbon, it is preferable that the dielectric layer 11a in each of the bases 11 and 31 should not contain carbon. In each of the bases 11 and 31, a portion other than the dielectric layer 11a, that is, the sintered body composing a layer under the electrode 12, may contain carbon, or not.

It is preferable that a withstand voltage (JIS C2141) of the sintered body composing each of the bases 11 and 31 of the electrostatic chucks 10 and 30 be 15 kV/mm or more. It is more preferable that the withstand voltage of the sintered body composing each of the bases 11 and 31 be 18 kV/mm or more. According to this, the arcing can be prevented from occurring.

The bases 11, 21 and 31 have holes 15 and 25 for inserting the terminals 14 and 24 thereinto. The holes 15 and 25 extend from back surfaces 17, 27 and 37 (opposite surfaces to the substrate mounting surfaces 16, 26 and 36) of the bases 11, 21 and 31 to the bonding members 13 and 23. Accordingly, partial portions (regions facing to the holes 15 and 25) of the bonding members 13 and 23 are exposed. The base 21 has two holes 25 for inserting two terminals 24 thereinto. The base 31 has three holes 15 and 25 for inserting three terminals 14 and 24 thereinto.

The electrodes 12 and the resistance heating elements 22 are embedded in the bases 11, 21 and 31. The electrodes 12 and the resistance heating elements 22 are power-supplied members to be supplied with electric power. For the power-supplied members, for example, a high melting point conductive material can be used. Specifically, as the power-supplied members, there can be used high melting point metal such as tungsten (W), niobium (Nb), and molybdenum, an alloy thereof, and a compound of high melting point metal such as tungsten carbide (WC).

Each of the electrodes 12 generates the absorbing power by being supplied with the electric power. For the electrode 12, for example, a printed electrode on which a print paste containing high melting point conductive material powder is printed in a mesh shape, a comb shape, a circular shape, or the like can be used. In this case, it is preferable that the electrode 12 be formed by using a print paste in which alumina powder is mixed into the high melting point conductive material powder. According to this; the electrode 12 can be firmly bonded to each of the bases 11 and 31. Moreover, for the electrode 12, a mesh-like bulk member (wire netting) of the high melting point conductive material, a bulk member (punching metal) of the high melting point conductive material, into which a large number of holes is drilled, and the like can be used.

Each of the resistance heating elements 22 generates heat by being supplied with the electric power. For the resistance heating element 22, a printed heating element on which the print paste containing the high melting point conductive material powder is printed in a spiral shape, a mesh shape, a shape folded plural times, and the like, can be used. In this case, it is preferable that the resistance heating element 22 be formed by using the print paste in which the alumina powder is mixed into the high melting point conductive material powder. According to this, the resistance heating element 22 can be firmly bonded to each of the bases 11 and 31. Moreover, for the resistance heating element 22, a coil-like or linear bulk member of the high melting point conductive material, and the mesh-like bulk member (wire netting) of the high melting point conductive material, can be used.

The bonding member 13 is embedded in each of the bases 11 and 31. The electrode 12 as the power-supplied member and the terminal 14 are bonded to each other through the bonding member 13. The bonding members 23 are embedded in the bases 21 and 31. Moreover, the resistance heating elements 22 as the power-supplied members and the terminals 24 are bonded to each other through the bonding members 23.

A difference between a coefficient of thermal expansion (CTE) of each of the bonding members 13 and 23 and a coefficient of thermal expansion of the alumina-containing sintered body composing each of the bases 11, 21 and 31 is $2\times10^{-6}$/K or less. According to this, the different in coefficient of thermal expansion between each of the bases 11, 21 and 31 of the alumina-containing sintered bodies and each of the bonding members 13 and 23 is small, and accordingly, cracks which may be caused by embedding the bonding members 13 and 23 into the bases 11, 21 and 31 can be prevented from occurring. Therefore, the strengths of the alumina members 10 and 30 and the heater 20 can be maintained high. Moreover, the arcing can also be prevented from occurring. It is more preferable that the difference in coefficient of thermal expansion between each sintered body of the bonding members 13 and 23 and each of the bases 11, 21 and 31 be $1.5\times10^{-6}$/K or less.

Each melting point of the bonding members 13 and 23 is higher than baking temperature of the sintered body composing each of the bases 11, 21 and 31. According to this, even if the bonding members 13 and 23 are maintained at the baking temperature in a manufacturing process of the alumina member such as the electrostatic chucks 10 and 30 and the heater 20, the bonding members 13 and 23 can be prevented from being deformed, and a component of the bonding members can be prevented from being diffused into the bases 11, 21 and 31. Hence, a malfunction does not occur owing to the embedding of the bonding members 13 and 23. It is preferable that each melting point of the bonding members 13 and 23 be higher than the baking temperature of the sintered body by 50° C. or more.

It is preferable that the bonding members 13 and 23 contain at least one of either niobium (Nb) or platinum (Pt). According to this, the terminals 14 and 24 can be bonded to the electrodes 12 and the resistance heating elements 22, which are the power-supplied members, more firmly. In addition, the bases 11, 21 and 31 composed of the alumina-containing sintered bodies and the bonding members 13 and 23 can be approximated to each other in coefficient of thermal expansion. Accordingly, the cracks which may be caused by embedding the bonding members 13 and 23 in the bases 11, 21 and 31 can be further prevented from occurring. Moreover, the arcing can also be prevented. Furthermore, when the bonding members 13 and 23 contain platinum, the component of the bonding members can be prevented from being diffused into the bases 11, 21 and 31 by a heat treatment such as baking in the manufacturing process of the alumina member. Furthermore, the melting point of niobium is 2470° C., and the melting point of platinum is 1770° C. The baking temperature of the alumina-containing sintered body can be selected, for example, from a range of 1500 to 1700° C. Hence, each melting point of the bonding members 13 and 23 can be set higher than the baking temperature by 50° C. or more.

For example, as the bonding members 13 and 23, there can be used niobium, alloys of niobium and various metals, platinum, alloys of platinum and various metals, and the like. It is preferable that the bonding members 13 and 23 be composed of niobium or platinum. In the case of using the alloys as the bonding members 13 and 23, it is preferable that a content of niobium or platinum be 50 vol % or more.

The shapes of the bonding members 13 and 23 are not limited. For example, the bonding members 13 can be formed into a disc shape (columnar shape), and the bonding members 23 can be formed into a ball shape. According to these, the cracks can be further prevented from occurring between the bonding members 13 and 23 and the bases 11, 21 and 31, and the strengths of the electrostatic chucks 10 and 30 and the heater 20 can be further enhanced. Moreover, the arcing can also be prevented from occurring.

It is preferable that thickness (vertical height in FIG. 1) of each disc-like bonding member 13 be 0.2 to 1.0 mm. It is preferable that diameter of the bonding member 13 be 0.5 to 4.0 mm. It is more preferable that the thickness of the bonding member 13 be 0.5 to 1.0 mm, and it is more preferable that the diameter thereof be 0.5 to 3.0 mm. It is preferable that diameter of the ball-like bonding member 23 be 2.0 to 6.0 mm. It is more preferable that the diameter of the bonding member 23 be 3.0 to 5.0 mm. The shapes of the bonding members 13 and 23 may also be oval and the like.

For example, as shown in FIG. 1A and FIG. 3, each bonding member 13 is provided in contact with the power-supplied member such as the electrode 12, and is bonded to the power-supplied member by being heated and pressurized, for example, by hot pressing. Moreover, as shown in FIG. 2A and FIG. 3, each bonding member 23 can have a through hole 23a. An end of the power-supplied member such as the coil-like resistance heating element 22 is inserted into the through hole 23a, the bonding member 23 and the power-supplied member are heated and pressurized, for example, by the hot pressing, and the bonding member 23 is thus bonded to the power-supplied member. In particular, it is preferable that the bonding members 13 and 23 be bonded to the power-supplied members such as the electrodes 12 and the resistance heating elements 22 by thermal pressure bonding according to the hot pressing. According to this, the bonding members 13 and 23 are firmly bonded to the electrodes 12 and the resistance heating elements 22, and the bonding of the terminals 14 and 24 to the electrodes 12 and the resistance heating elements 22, the bonding being formed through the bonding members 13 and 23, can be made firmer.

The terminals 14 are bonded to the electrodes 12 through the bonding members 13. To the terminals 14, power supply lines for supplying the electric power to the electrodes 12 are connected. The terminals 24 are bonded to the resistance heating elements 22 through the bonding members 23. To the terminals 24, power supply lines for supplying the electric power to the resistance heating elements 22 are connected. The terminals 14 and 24 are inserted into the holes 15 and 25 drilled in the bases 11, 21 and 31, and are bonded to the exposed portions of the bonding members 13 and 23. The terminals 14 and 24 can be composed of molybdenum and niobium. Surfaces of the terminals 14 and 24 may also be coated with gold (Au) and nickel (Ni).

The bonding members 13 and 23 and the terminals 14 and 24 can be bonded to each other, for example, by brazing. A metal brazing material, a composite brazing material as a composite material of metal and ceramics, and the like, can be used as the brazing material. For example, as the brazing material, there can be used indium (In), gold, silver (Ag), aluminum (Al), nickel (Ni), an aluminum-alumina composite material (aluminum-alumina composite brazing), an alloy containing at least two of the following: indium, gold, silver, aluminum, nickel, and titanium.

In particular, it is preferable that the bonding members 13 and 23 and the terminals 14 and 24 be bonded to each other by any of indium, gold, silver, the aluminum-alumina composite material (aluminum-alumina composite brazing), and a gold-nickel ally (Au—Ni). According to this, the bonding members 13 and 23 and the terminals 14 and 24 are firmly bonded to each other, and the bonding of the terminals 14 and 24 to the electrodes 12 and the resistance heating elements 22, both of which are bonded to each other through the bonding members 13 and 23, can be made firmer.

The brazing can be performed by interposing the brazing material between the bonding members 13 and 23 and the terminals 14 and 24 and heating all the above at 130 to 1100° C. Moreover, the bonding members 13 and 23 may also have recessed portions into which the terminals 14 and 24 are insertable. In this case, the terminals 14 and 24 can be inserted into the recessed portions of the bonding members 13 and 23, and can be thus bonded to the bonding members 13 and 23.

Moreover, it is preferable that tensile strengths of the bases 11, 21 and 31 at breaking points thereof in the case of applying loads to pull the bases 11, 21 and 31 and the terminals 14 and 24 in directions separating from each other be 1.0 kg weight/mm$^2$ or more. According to this, the terminals 14 and 24 can be firmly bonded to the electrodes 12 and the resistance heating elements 22. More preferable tensile strengths are 1.4 kg weight/mm$^2$ or more.

Figure 4:
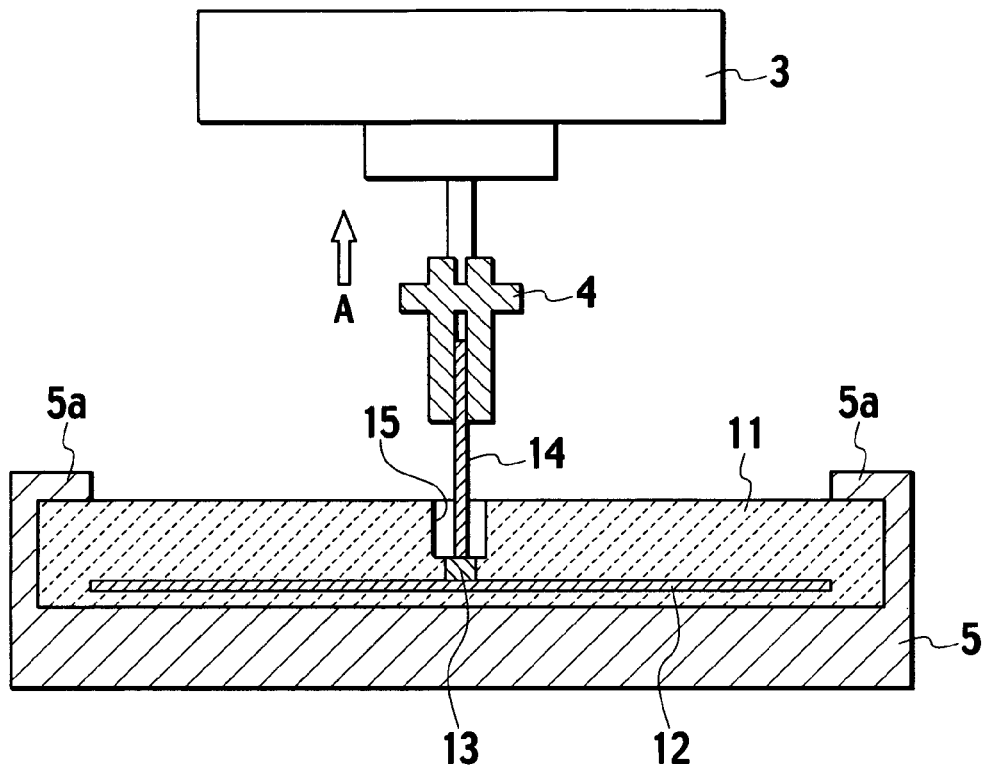
FIG. 4 is a schematic view showing a measurement method of tensile strength.

Here, an example of a method of measuring such tensile strength of each base at the breaking point thereof in the case of applying the load to pull each base and each terminal in the reverse directions is shown in FIG. 4. A description will be made with reference to FIG. 4 by taking the electrostatic chuck 10 shown in FIG. 1, as an example of the alumina member. The base 11 is fixed to a fixture 5 which includes a folded portion 5a for holding the base 11 and fixes the base 11. The terminal 14 is grasped by a pulling jig 4 which grasps and pulls the terminal 14. The pulling jig 4 is connected to an auto graph 3. The terminal 14 is pulled by using the auto graph 3 through the pulling jig 4 so as to separate from the base 11, that is, in a direction of an arrow A in FIG. 4, and in such a way, such a tensile load to pull the base 11 and the terminal 14 in the reverse directions is applied to both thereof. The tensile strength of the base 11 at the breaking point thereof is measured by the auto graph 3.

Moreover, it is preferable that a punching load to the base at the breaking point thereof in the case of applying the load to the base in a direction from the terminal toward the bonding member be 30 kg weight or more. According to this, the strengths of the bases 11, 21 and 31 in the peripheries of bonded portions of the terminals 14 and 24 to the electrodes 12 and the resistance heating elements 22 can be increased, and the strengths of the entire alumina members such as the electrostatic chucks 10 and 30 and the heater 20 can be maintained high. A more preferable punching load is 40 kg weight or more.

Figure 5:
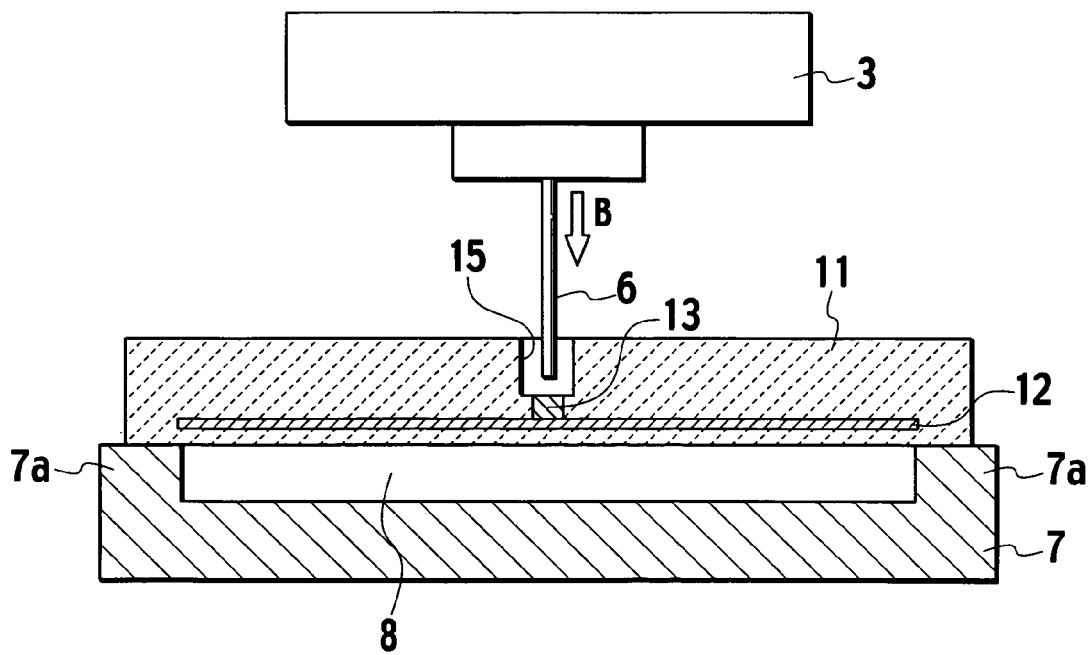
FIG. 5 is a schematic view showing a measurement method of a punching load.

Here, an example of a method of measuring the punching load to the base at the breaking point thereof in the case of applying the load thereto in the direction from the terminal toward the bonding member is shown in FIG. 5. A description will be made with reference to FIG. 5 by taking the electrostatic chuck 10 shown in FIG. 1, as an example of the alumina member. The base 11 is mounted on a support jig 7 which includes a protruding portion 7a supporting the base 11 while providing a space 8 between the base 11 and the support jig 7 and supports the base 11. By using the auto graph 3, the load is applied through a push rod 6 to the bonding member 13 from a position thereof where the terminal 14 is to be provided, in a direction toward the bonding member 13 (direction of arrow B in FIG. 5). The push rod 6 and the autograph 3 are connected to each other. By the auto graph 3, the punching load to the base 11 at the breaking point thereof is measured. As described above, the load is applied to the base from the position thereof where the terminal is to be provided, in the direction toward the bonding member in a state where the terminal is not provided, thus making it possible to measure the punching load.

Moreover, it is preferable that the withstand voltage of the alumina member such as the electrostatic chucks 10 and 30 and the heater 20 be stable at 3 kV/mm or more. According to this, the arching can be prevented from occurring during use of the alumina member.

Moreover, it is preferable that the base 11, the bonding member 13, and the electrode 12 be an integral sintered body. It is preferable that the base 21, the bonding members 23, and the resistance heating element 22 be an integral sintered body. It is preferable that the base 31, the bonding members 13 and 23, the electrode 12, and the resistance heating element 22 be an integral sintered body. According to these, the basses 11, 21 and 31, the bonding members 13 and 23, and the power-supplied members such as the electrodes 12 and the resistance heating elements 22 are bonded to one another more firmly. In particular, it is preferable that each integral sintered body be formed by the sintering using the hot pressing.

The alumina members such as the electrostatic chucks 10 and 30 and the heater 20 can be manufactured by a step of fabricating the bases 11, 21 and 31 composed, for example, of the alumina-containing sintered bodies, in which the differences in coefficient of thermal expansion from the sintered bodies concerned to the electrodes 12 and the resistance heating elements 22, which are the power-supplied members, are $2 \times 10^{-6}$/K or less, and the bonding members 13 and 23 bonded to the electrodes 12 and the resistance heating elements 22 are embedded, and a step of bonding the terminals 14 and 24 to the bonding members 13 and 23.

A description will be made, as an example, of a manufacturing method of the electrostatic chuck 10 and the heater 20. First, alumina granulated powder is prepared. To material powder of the alumina-containing sintered body, a binder, water, a dispersant, and the like are added and mixed, and slurry is thus prepared. For the material powder, there can be used only the alumina powder, mixed powder of the alumina powder and zirconia powder, mixed powder of the alumina powder and magnesia powder, and the like. The obtained slurry is granulated by spray granulation, and the alumina granulated powder is thus obtained.

Next, the alumina-containing sintered body is fabricated. The obtained alumina granulated powder is molded by a molding method such as die molding and cold isostatic pressing (CIP). A compact thus obtained is sintered at 1500 to 1700° C. by a sintering method such as the hot pressing and normal pressure sintering in an atmosphere of inert gas such as nitrogen gas and argon gas or an oxidation atmosphere. More preferable sintering temperature is 1600 to 1700° C.

Next, the power-supplied member such as the electrode 12 and the resistance heating element 22 is formed on a sintered body thus obtained. For example, the electrode 12 or the resistance heating element 22 can be formed by being printed on the surface of the sintered body by screen printing or the like. In this case, it is preferable to mix the alumina powder in the print paste containing the high melting point conductive material powder of tungsten, niobium, molybdenum, an alloy of these, tungsten carbide, and the like. According to this, adherence of the bases 11 and 21 to the electrode 12 and the resistance heating element 22 can be enhanced. Moreover, the electrode 12 can also be formed by mounting, on the sintered body, the mesh-like bulk member (wire netting) of the high melting point conductive material, the bulk member (punching metal) of the high melting point conductive material, into which a large number of holes is drilled, and the like. Moreover, the resistance heating element 22 can also be formed by mounting, on the sintered body, the coil-like or linear bulk member of the high melting point conductive material, and the mesh-like bulk member (wire netting) of the high melting point conductive material.

Next, the bonding member 13 and 23 are disposed in contact with the power-supplied members such as the electrode 12 and the resistance heating element 22. For example, by mounting the bonding member 13 on the electrode 12, the bonding member 13 can be disposed in contact with the electrode 12. Moreover, by inserting the end of the coil-like resistance heating element 22 into the through hole 23a of the bonding member 23, the bonding member 23 can be disposed in contact with the resistance heating element 22. Note that, for the bonding members 13 and 23, ones in which melting point is higher than the baking temperature are used in the following fabrication of the sintered body by the hot pressing. According to this, in the manufacturing process, the bonding members 13 and 23 can be prevented from being deformed, and the component of the bonding members can be prevented from being diffused into the bases 11 and 21.

Next, in a die mold, each of the sintered bodies, in which the power-supplied members such as the electrode 12 and the resistance heating element 22 are formed, and the bonding members 13 and 23 are disposed, is set. Then, the sintered body, the power-supplied member, and the bonding member are filled with the prepared alumina granulated powder, and the alumina-containing compact is thus formed. Note that the compact may be formed separately, and mounted on the sintered body, followed by press molding.

Then, the alumina-containing compacts, the power-supplied members such as the electrode 12 and the resistance heating element 22, the bonding members 13 and 23, and the alumina-containing sintered bodies, are integrally sintered by the hot pressing, and the integral sintered bodies are thus obtained. According to this, the power supplied members such as the electrode 12 and the resistance heating element 22 and the bonding members 13 and 23 can be subjected to the thermal pressure bonding by the hot pressing. Hence, the electrode 12 and the resistance heating element 22 which are the power-supplied members and the bonding members 13 and 23 can be firmly bonded to each other, and the bonding of the terminals 14 and 24 to the electrode 12 and the resistance heating element 22, the bonding being formed through the bonding members 13 and 23, can be made firmer.

Specifically, the baking is performed at 1500 to 1700° C. in the atmosphere of inert gas such as nitrogen gas and argon gas or the oxidation atmosphere while pressurization is being performed in an axial direction. According to this, the power-supplied members such as the electrode 12 and the resistance heating element 22 and the bonding members 13 and 23 can be bonded to each other more firmly. More preferable baking temperature is 1600 to 1700° C. Moreover, it is preferable that the pressure to be applied be 50 to 300 kg/cm². According to this, the power-supplied members such as the electrode 12 and the resistance heating element 22 and the bonding members 13 and 23 can be bonded to each other more firmly. More preferable pressure to be applied is 100 to 200 kg/cm².

In the case of performing the baking in such a state where the bonding member 13 and 23 are in contact with the alumina-containing compacts as described above, it is preferable that the baking be performed in a state where carbon is present in the periphery of each of the bonding members 13 and 23. According to this, the component of the bonding members can be prevented from being diffused into the bases 11 and 21. In particular, though the component of the bonding members is sometimes diffused into the bases 11 and 21 when the bonding members 13 and 23 contain niobium, such diffusion can be prevented by performing the baking in the state where carbon is present in the peripheries of the bonding members 13 and 23.

For example, the alumina-containing compacts contain the binder serving as a carbon source as described above, thus making it possible to perform the baking in the state where carbon is present in the peripheries of the bonding members 13 and 23. Alternatively, the alumina-containing compacts may contain carbon powder, or may contain both of the binder and the carbon powder. Although the binder is not limited as long as the binder turns to carbon by the baking, for example, it is preferable to use, as the binder, polyvinyl alcohol (PVA), stearic acid, and the like.

In this case, it is satisfactory if at least a part of each compact contains at least one of either the carbon powder or the binder serving as the carbon source. It is preferable that the compact which turns to the dielectric layer 11a by the baking should not contain the carbon powder or the binder. The compact which turns to the sintered body composing the layer under the electrode 12 by the baking may contain the carbon powder and the binder, or not.

In this case, it is preferable to adjust the content and baking conditions of at least one of either the carbon powder or the binder in the compact so that carbon contained in at least a part of the sintered body of the base can be 0.05 to 0.5 wt %, that is, so that an amount of residual carbon remaining in the sintered body can be 0.05 to 0.5 wt %. According to this, a stronger alumina member such as the electrostatic chuck 10 and the heater 20 can be provided. For example, in the base 11, an adjustment can be performed so that a portion other than the dielectric layer 11a, that is, the sintered body composing the layer under the electrode 12 can contain 0.05 to 0.5 wt % carbon.

For example, in the case of fabricating the binder-containing compact, the binder content can be set at 1 to 11 wt %. Moreover, in the case of fabricating the carbon powder-containing compact, the carbon content can be set at 0.05 to 0.5 wt %. Then, the baking conditions such as the baking temperature, a holding time (baking time) at the baking temperature, and a temperature rise rate are adjusted, thus making it possible to adjust the amount of carbon (residual amount of carbon) contained in the sintered body at 0.05 to 0.5 wt %. The baking temperature can be selected, for example, from 1500 to 1700° C. The baking time can be set, for example, at 1 to 4 hours. The temperature rise rate can be set, for example, so as to be 100 to 700° C. per hour from room temperature to approximately 1100° C., and then to be 30 to 150° C. per hour in a range of approximately 1400 to 1700° C.

In the case of fabricating the compact which does not contain the carbon powder or the binder, the bonding members 13 and 23 are coated with carbon or the carbon sources, thus making it possible to perform the baking in the state where carbon is present in the peripheries of the bonding members 13 and 23. For example, tape-like carbon and a tape-like carbon source which turns to carbon by baking resin and the like can be pasted onto the bonding members 13 and 23. Moreover, a solution or paste containing the carbon or the carbon source can be sprayed to the bonding members 13 and 23 by using a spray and the like, can be coated on the bonding members 13 and 23 by using a brush and the like, and so on. Alternatively, the bonding members 13 and 23 may be immersed in the solution or paste containing carbon and the carbon source, followed by raising (dipping). As a solvent, for example, thinner and the like can be used. It is preferable that thickness of carbon and the carbon source, which cover the bonding members 13 and 23, be, for example, approximately 50 to 200 μm.

Next, the integral sintered bodies thus obtained are processed. Specifically, the holes 15 and 25 are drilled in the bases 11 and 21. The holes 15 and 25 are drilled on the opposite surfaces of the bases 11 and 21 to the substrate mounting surfaces 16 and 26. The holes 15 and 25 are drilled to depth at which the bonding members 13 and 23 are exposed. Moreover, in the case of the electrostatic chuck 10, it is preferable to grind the sintered body so that the thickness of the dielectric layer 11a can be 0.2 to 0.5 mm.

Finally, the terminals 14 and 24 are bonded to the bonding members 13 and 23, and the terminals 14 and 24 are bonded to the power-supplied members such as the electrode 12 and the resistance heating element 22 through the bonding members 13 and 23. The terminals 14 and 24 are inserted into the holes 15 and 25 drilled in the bases 11 and 21, and are bonded to the exposed portions of the bonding members 13 and 23. The bonding members 13 and 23 and the terminals 14 and 24 are bonded to each other by the brazing.

In the electrostatic chuck 30, the electrode 12 is formed on the alumina-containing sintered body, the bonding member 13 is disposed therebetween, the granulated granules are filled thereinto, and the compact is thus fabricated on the sintered body. Moreover, the resistance heating element 22 is formed on the fabricated compact, the bonding members 23 are disposed therebetween, the granulated granules are filled thereinto, and the compact is thus fabricated. The electrostatic chuck 30 can be manufactured in a similar way to the electrostatic chuck 10 and the heater 20 except the above-described points.

Note that the power-supplied member is formed on the alumina-containing compact, the bonding member is disposed therebetween, and the alumina granulated powder is filled thereonto, and in such a way, the compact in which the power-supplied member and the bonding member are embedded may be fabricated. Also in this case, the obtained compact can be integrally baked by the hot pressing. As described above, when the alumina-containing compact, the power-supplied member, and the bonding member are integrally baked by the hot pressing, and the power-supplied member and the bonding member are bonded to each other, the entire portion which becomes each of the bases 11, 21 and 31 may be made as the alumina compact, and a part thereof may be made as the alumina sintered body.

As described above, in accordance with the alumina members such as the electrostatic chucks 10 and 30 and the heater 20 of this embodiment, the terminals 14 and 24 are firmly bonded to the power-supplied members such as the electrodes 12 and the heat resistance elements 22 through the bonding members 13 and 23. Moreover, the bases 11, 21 and 31 as the alumina-containing sintered bodies and the bonding members 13 and 23 are approximate to each other in coefficient of thermal expansion. Accordingly, the cracks which may be caused by embedding the bonding members 13 and 23 into the bases 11, 21 and 31 can be prevented from occurring. Hence, the strengths of the alumina members 10 and 30 and the heater 20, which are the alumina members, can be enhanced by embedding the bonding members 13 and 23 therein. In addition, the cracks which may be caused by the embedding can also be prevented from occurring. Therefore, the strength of each alumina member can be increased. Moreover, the arcing which may be caused by the cracks can be prevented from occurring. In addition, the melting point of the bonding members 13 and 23 is higher than the baking temperature of the sintered bodies. Accordingly, in the manufacturing process of the alumina members, the bonding members 13 and 23 can be prevented from being deformed, and the component of the bonding members can be prevented from being diffused into the bases 11, 21 and 31. Hence, the malfunction does not occur owing to the embedding of the bonding members 13 and 23.

Moreover, distances from the holes 15 and 25 for inserting the terminals 14 and 24 thereinto, which are drilled in the bases 11, 21 and 31, to the substrate mounting surfaces 16, 26 and 36 can be elongated by the lengths of the bonding members 13 and 23, and the strengths of the electrostatic chucks 10 and 30 and the heater 20 can be enhanced. Hence, even in the Coulomb-type electrostatic chucks 10 and 30 in each of which the thickness of the dielectric layer 11a is thin, the strengths thereof are not reduced owing to the formation of the holes 15 and 25. In addition, when the holes 15 and 25 are drilled in the bases 11, 21 and 31, the positions and depths of the holes 15 and 25 can be determined by using the bonding members 13 and 23, and processing accuracy can also be enhanced.

EXAMPLES

Next, the present invention will be described more in detail by examples; however, the present invention is not limited to the following examples at all.

Examples 1 to 6, Comparative Examples 1 to 3

As ceramics material powder, alumina powder with a purity of 99.9 wt % and a mean particle diameter of 0.5 μm was prepared. To the alumina powder, water, the dispersant, and polyvinyl alcohol as the binder were added, and were mixed by a trammel, and the slurry was thus prepared. The obtained slurry was sprayed and dried by using a spray dryer, and the alumina granulated powder was prepared. The prepared alumina granulated powder was filled into the die mold, and was pressurized with 200 kg/cm$^2$, and nine compacts were fabricated.

The obtained alumina compacts were set in a carbon-made sheath, were baked by the hot pressing, and the alumina sintered bodies were obtained. Specifically, the compacts were baked in a nitrogen-pressurized atmosphere (nitrogen: 150 kPa) while being pressurized with 100 kg/cm$^2$. Moreover, the baking was performed while raising the temperature from room temperature to 1600° C. at a rate of 100° C. per hour and maintaining the temperature at 1600° C. for two hours.

Next, ethylene cellulose was mixed as the binder into mixed powder of 80 wt % tungsten (W) and 20 wt % alumina, and the print paste was prepared. The electrode was formed on the alumina sintered body by the screen printing, followed by drying. Next, bonding members of Examples 1 to 6 and Comparative examples 2 and 3 were mounted on the electrodes of eight sintered bodies.

Each alumina sintered body in which the electrode was formed and on which the bonding member was mounted was set in the die mold. The prepared alumina granulated powder was filled on the alumina sintered body, the electrode, and the bonding member, and was pressurized with 200 kg/cm$^2$, and press molding was thus performed therefor. Moreover, as Comparative example 1, the alumina granulated granules were filled on the alumina sintered body and the electrode without mounting the bonding member thereon, and the press molding was thus performed therefor.

The integrally molded alumina sintered body, electrode, bonding member, and alumina compact were set in the carbon-made sheath, and were baked by the hot pressing. Specifically, the set objects were baked in the nitrogen-pressurized atmosphere (nitrogen: 150 kPa) while being pressurized with 100 kg/cm$^2$, and the bonding member and the electrode were bonded to each other. Moreover, the baking was performed while raising the temperature from room temperature to 1600° C. at a rate of 100° C. per hour and maintaining the temperature at 1600° C. for two hours.

The integral sintered body thus obtained was processed into a disc shape with a diameter of 340 mm and a thickness of 5 mm, and a hole for attaching the terminal thereinto was drilled. The hole was processed so that a diameter thereof could be 6 mm and a distance from the substrate mounting surface to the hole could be 0.4 mm. Moreover, the integral sintered body was ground so that thickness from the base surface of the alumina sintered body to the electrode could be 0.3 mm. Then, the bonding member and the molybdenum terminal were brazed by using indium as the brazing material while being heated at 150° C., and the electrode and the terminal were bonded to each other through the bonding member. In such a way, the alumina members of Examples 1 to 6 and Comparative examples 2 and 3 were fabricated. Moreover, the electrode and the terminal were directly bonded to each other, and the alumina member of Comparative example 1 was fabricated.

Niobium was used as the material of the bonding members of Examples 1 to 5. Moreover, the bonding members of Examples 1 to 5 were formed into disc shapes with the following diameters and thicknesses: a diameter of 3.0 mm and a thickness of 1.0 mm in Example 1; a diameter of 3.0 mm and a thickness of 0.5 mm in Example 2; a diameter of 3.0 mm and a thickness of 0.2 mm in Example 3; a diameter of 2.0 mm and a thickness of 0.5 mm in Example 4; and a diameter of 2.0 mm and a thickness of 0.2 mm in Example 5. The bonding member of Example 6 was formed of platinum (pt) as the material into a disc shape with a diameter of 3.0 mm and a thickness of 1.0 mm.

The bonding member of Comparative example 2 was formed of molybdenum (Mo) as the material into a disc shape with a diameter of 3.0 mm and a thickness of 1.0 mm. The bonding member of Comparative example 3 was made as a compact with 60 wt % tungsten (W) and 40 wt % alumina ($Al_2O_3$). For the bonding member of Comparative example 3, a compact in a disc shape with a diameter of 3.0 mm and a thickness of 1.0 mm was fabricated by the die molding.

The coefficient of thermal expansion of the alumina sintered body composing the base of the obtained alumina member and the coefficient of thermal expansion of the bonding member were measured by a differential dilatometer (TM8310 made by Rigaku Corporation), and the difference in coefficient of thermal expansion between both thereof was obtained. Moreover, the surface and longitudinal cross section of the alumina member was observed by a scanning electron microscope (SEM), and it was confirmed whether or not the crack occurred and the component of the bonding member was diffused into the base of the alumina sintered body. Moreover, the load to pull the base and the terminal in the directions separating from each other was applied thereto by the measurement method shown in FIG. 4, the tensile strength of the base at the breaking point thereof was measured, and the strength of the bonding of the electrode and the terminal was evaluated. Note that a pulling rate was set at 0.5 mm per minute. Moreover, the load was applied to the base in the direction from the terminal toward the bonding member by the measurement method shown in FIG. 5, the punching load to the base at the breaking point thereof was measured, and the strength of the alumina member was evaluated. Note that a loading rate was set at 0.5 mm per minute, and the push rod 6 with a diameter of 2 mm was used. Moreover, the measurement was performed before attaching the terminal to the base. Furthermore, withstand voltage characteristics of the bonded body in which the terminal, the bonding member, and the electrode were bonded to one another were evaluated by applying a voltage of 3 kV to the terminal and confirming whether or not the arcing occurred. Results are shown in Table 1.

TABLE 1

| | Bonding member | Difference in coefficient of thermal expansion (/K) | Crack | Diffusion | Tensile strength (kg wt/mm²) | Punching load (kg wt) | Withstand voltage characteristics |
|---|---|---|---|---|---|---|---|
| Example 1 | Nb: Ø 3.0 mm × t 1.0 mm | $1.3 \times 10^{-6}$ | None | None | 1.4 | 69 | Arcing did not occur |
| Example 2 | Nb: Ø 3.0 mm × t 0.5 mm | $1.3 \times 10^{-6}$ | None | None | 1.4 | 46 | Arcing did not occur |
| Example 3 | Nb: Ø 3.0 mm × t 0.2 mm | $1.3 \times 10^{-6}$ | None | None | 1.4 | 35 | Arcing did not occur |
| Example 4 | Nb: Ø 2.0 mm × t 0.5 mm | $1.3 \times 10^{-6}$ | None | None | 1.0 | 44 | Arcing did not occur |
| Example 5 | Nb: Ø 2.0 mm × t 0.2 mm | $1.3 \times 10^{-6}$ | None | None | 1.0 | 34 | Arcing did not occur |
| Example 6 | Pt: Ø 3.0 mm × t 1.0 mm | $0.6 \times 10^{-6}$ | None | None | 1.4 | 57 | Arcing did not occur |
| Comparative Example 1 | — | — | Present | — | 0.2 | 21 | Arcing occurred |
| Comparative Example 2 | Mo: Ø 3.0 mm × t 1.0 mm | $3 \times 10^{-6}$ | Present | None | 0.8 | 21 | Arcing occurred |
| Comparative Example 3 | W + $Al_2O_3$: Ø 3.0 mm × t 1.0 mm | $1.4 \times 10^{-6}$ | Present | None | 0.8 | 20 | Arcing occurred |

As shown in Table 1, in the alumina members of Examples 1 to 5, in each of which the electrode and the terminal were bonded to each other through the niobium-made bonding member, and of Example 6 in which the electrode and the terminal were bonded to each other through the platinum-made bonding member, the tensile strengths were as high as 1.0 kg weight/mm² or more, and the electrodes and the terminals were firmly bonded to each other.

Moreover, each alumina member of Examples 1 to 6 had the punching load of 30 kg weight or more, and had higher strength than that of Comparative example 1 equivalent to the conventional alumina member which does not include the bonding member. As described above, in Examples 1 to 6, the bonding members were provided, and in such a way, even if the holes for inserting the terminals thereinto were drilled, the strengths of the bases in the peripheries of the bonded portions of the electrodes and the terminals were high, and the strengths of the alumina members were maintained high. In particular, in the alumina members of Examples 2 and 4 in each of which the thickness of the bonding member was 0.5 mm, the punching loads were 40 kg weight or more, and in the alumina members of Examples 1 and 6 in each of which the thickness of the bonding member was 1.0 mm, the punching loads were 55 kg weight or more, and the strengths were high.

Moreover, in each alumina member of Examples 1 to 5, the difference in coefficient of thermal expansion between the base and the bonding member was $1.3 \times 10^{-6}$/K. In the alumina member of Example 6, the difference in coefficient of thermal expansion between the base and the bonding member was $0.6 \times 10^{-6}$/K. No crack occurred in the bases of the alumina sintered bodies of Examples 1 to 6. Accordingly, when the punching loads in Examples 1 and 6 and the punching loads in Comparative examples 2 and 3, between which the thicknesses of the bonding members were the same, are compared with each other, the alumina members in Examples 1 and 6 free from the crack had the strengths approximately three times those of the alumina members in Comparative examples 2 and 3 in which the cracks occurred. Hence, it was found that the base and the bonding member are approximated to each other in coefficient of thermal expansion so that the difference therebetween can be $2 \times 10^{-6}$ or less, thus making it possible to prevent the crack from occurring, thereby making it possible to enhance the strength of each alumina member. Moreover, in each alumina member of Examples 1 to 6 free from the crack, the arcing did not occur, and the alumina member was excellent in withstand voltage characteristics.

Moreover, the melting point of the bonding members of Examples 1 to 5 is 2470° C., and the melting point of the bonding member of Example 6 is 1770° C. Both of the melting points are higher than the baking temperature of 1600° C. by 150° C. or more. Accordingly, each bonding member was not deformed either. Furthermore, each component of the boding members of Examples 1 to 6 was not diffused into the base.

In comparison with the alumina members of Examples 1 to 6, in each of the alumina member of Comparative example 1 in which the electrode and the terminal are directly bonded to each other without providing the bonding member, the alumina member of Comparative example 2 using the molybdenum-made bonding member, and the alumina member of Comparative example 3 using, as the bonding member, the compact of tungsten and alumina, the tensile strength was weak, and the bonding was weak.

Moreover, in the alumina member of Comparative example 1 in which the bonding member is not provided, the punching load was also extremely low, and the strength was low. Furthermore, in each alumina member of Comparative examples 2, the crack occurred in the base of the alumina sintered body owing to the difference in coefficient of thermal expansion between the electrode and the base and owing to the difference in coefficient of thermal expansion between the bonding member and the base. In the alumina member of Comparative example 3, though the crack did not occur immediately after the baking, the crack occurred in the alumina member after being processed for observing the cross section thereof. It is considered that this is because a residual stress was high, a residual stress was released by the processing, and the base was thereby broken. In each alumina member of Comparative examples 2 and 3, since the crack occurred, the punching load thereof was approximate one-third or less of those in Examples 1 and 6 in each of which the bonding member with the same thickness was provided, and the strength could not be maintained. Moreover, in each alumina member of Comparative examples 1 to 3, the arcing occurred owing to the crack, and the alumina member was also inferior in withstand voltage characteristics.

Examples 7 to 9

In Example 7, an alumina member in which the niobium-made bonding member was embedded was fabricated in a similar way to Example 1 except that polyvinyl alcohol as the binder was not added thereto. In Example 8, an alumina member on which the carbon tape was coated and in which the niobium-made bonding member was embedded was fabricated in a similar way to Example 7 except that the tape-like carbon (carbon tape) with a thickness of approximately 0.1 mm was pasted to the bonding member, and that the bonding member was coated with carbon. In Example 9, an alumina member in which the platinum-made bonding member was embedded was fabricated in a similar way to Example 6 except that polyvinyl alcohol as the binder was not added thereto.

For each of the alumina members of Examples 7 and 9, in a similar way to Example 1, it was confirmed whether or not the crack occurred and the component of the bonding member was diffused into the base of the alumina sintered body, and the punching load was measured. Moreover, by high frequency heating infrared absorptiometry, the amount of carbon contained in each alumina sintered body was measured. For each of Examples 1 and 6, the amount of carbon was measured. Results in Examples 1 and 6 to 9 are shown in Table 2.

TABLE 2

|  | Bonding member | Presence of carbon | Crack | Diffusion | Amount of carbon (wt %) | Punching load (kg wt) |
|---|---|---|---|---|---|---|
| Example 1 | Nb: Ø 3.0 mm × t 1.0 mm | binder is present | None | None | 1.4 | 69 |
| Example 7 | Nb: Ø 3.0 mm × t 1.0 mm | binder is not present | None | Present: 200 μm | 0 | 35 |
| Example 8 | Nb: Ø 3.0 mm × t 1.0 mm | binder is not present/ carbon tape is present | None | Present: 100 μm or less | 0 | 46 |
| Example 6 | Pt: Ø 3.0 mm × t 1.0 mm | binder is present | None | None | 1.5 | 57 |
| Example 9 | Pt: Ø 3.0 mm × t 1.0 mm | binder is not present | None | None | 0 | 49 |

As shown in Table 2, the cracks did not occur in Examples 7 to 9, either. Moreover, in Example 7 in which the niobium-made bonding member was used, the binder was not added, and the bonding member was not covered with the carbon tape, either, the diffusion of the component of the bonding member into the base was confirmed, and a diffusion layer with a thickness of 200 μm was formed in the periphery of the bonding member. As opposed to this, in Example 1 in which the binder was added even in the case of using the niobium-made bonding member, the diffusion of the component of the bonding member into the base was not observed at all. Moreover, in Example 8 in which the niobium-made bonding member was used, and the bonding member was covered with the carbon tape, though the diffusion of the component of the bonding member into the base was confirmed, the thickness of the diffusion layer was controlled to 100 μm or less. Specifically, in Example 8, the diffusion was extremely little, and the extent of the diffusion was improved to a great extent as compared with Example 7. Hence, it was able to be confirmed that the diffusion of the component of the bonding member into the base was able to be prevented by performing the baking in the state where carbon was present in the periphery of the bonding member.

Moreover, in the case of using the platinum-made bonding member, both in Example 6 in which the binder was added and in Example 9 in which the binder was not added, the diffusion of the component of the bonding member into the base was not observed at all. Hence, it was able to be confirmed that the diffusion of the component of the bonding member into the base was able to be prevented when the bonding member contained platinum.

Furthermore, in each of Examples 1 and 6 in each of which the amount of carbon contained in the alumina sintered body was 1.4 to 1.5 wt %, the punching load was higher than in Examples 7 to 9 in which carbon was not contained. Hence, it was able to be confirmed that the strength of the alumina member was able to be further improved in such a manner that the alumina member contained 0.05 to 0.5 wt % carbon.

Example 10

Alumina granulated powder was prepared in a similar way to Example 1. The prepared alumina granulated powder was filled into the die mold, and was pressurized with 200 kg/cm$^2$. While an alumina compact thus obtained was being set in the die mold, a mesh-like niobium-made electrode (line diameter: ø 0.12 mm; mesh: # 50 μm) was mounted on the alumina compact. Moreover, a disc-like niobium-made bonding member with a diameter of 3.0 mm and a thickness of 1.0 mm was mounted on the electrode.

The alumina granulated powder was filled onto the alumina compact, the electrode, and the bonding member, and was pressurized with 200 kg/cm$^2$, and the press molding was performed therefor. A coil-like niobium-made resistance heating element (line diameter: ø 0.5 mm; winding diameter: ø 3.0 mm) was mounted on the obtained alumina compact. Moreover, an end of the resistance heating element was inserted into a through hole of a ball-like niobium-made bonding member with a diameter of 4.0 mm, and the niobium-made bonding member was also mounted on the compact. The alumina granulated powder was filled onto the alumina compact, the resistance heating element, and the bonding member, and was pressurized with 200 kg/cm$^2$, and the press molding was performed therefor.

The obtained compact in which the electrode, the resistance heating element, and the bonding member were embedded was set in the carbon-made sheath, and was baked by the hot pressing. Specifically, the compact was baked in a nitrogen-pressurized atmosphere (nitrogen: 150 kPa) while being pressurized with 100 kg/cm$^2$. In such a way, the bonding member and the electrode were bonded to each other, and the bonding member and the resistance heating element were bonded to each other. Moreover, the above-described members were integrally baked while raising the temperature from room temperature to 1600° C. at a rate of 100° C. per hour and maintaining the temperature at 1600° C. for two hours.

An integral sintered body thus obtained was processed into a disc shape with a diameter of 330 mm and a thickness of 15 mm, and a hole for attaching the molybdenum-made terminal thereinto was formed therein. Then, the bonding member and the terminal were brazed to each other, the electrode and the terminal were bonded to each other through the bonding member, and the heat resistance element and the terminal were bonded to each other through the bonding member. The brazing was performed by using indium as the brazing material and performing the heating at 150° C. In such a way, as the alumina member, an electrostatic chuck subjectable to the heat treatment was fabricated.

When the obtained electrostatic chuck was observed by the SEM, the occurrence of the crack was not observed. Moreover, when the tensile strength and punching load of the electrostatic chuck was measured in a similar way to Example 1, both tensile strengths of the electrode portion and the resistance heating element portion were 1.4 kg weight/mm$^2$ or more, and the electrode portion and the heat resistance element portion were firmly bonded to each other. Moreover, the punching load of the electrode portion was 69 kg weight, the punching load of the resistance heating element portion was 70 kg weight or more, and the electrostatic chuck had high strength.

Moreover, a function as the electrostatic chuck was evaluated by applying a voltage of 2 kV thereto. By applying the voltage to the electrostatic chuck, the electrostatic chuck exerted absorbing power of 40 Torr. Moreover, leak current was 1 nA or less, responsiveness to attaching/detaching of the electrostatic chuck was 1 second or less, and volume resistivity of the dielectric layer at room temperature was $1\times10^{15}$ Ω·cm or more. The electrostatic chuck exerted electrostatic absorbing power (Coulomb force) up to 200° C. As described above, the alumina member was excellent in absorbing power and responsiveness to attaching/detaching thereof, and had excellent characteristics as the electrostatic chuck.

Moreover, a function as the heater was evaluated by measuring heat uniformity of the substrate mounting surface by a thermoviewer. A temperature difference within the substrate mounting surface when the temperature of the surface was set at 200° C. was 10° C. or less. As described above, the alumina member was excellent in heat uniformity, and had excellent characteristics also as the heater.

What is claimed is:

1. An alumina member, comprising:
   a base of a sintered body containing alumina;
   a power-supplied member embedded in the base and supplied with electric power, said power-supplied member being at least one of an electrode and a resistance heating element;
   a bonding member embedded in the base and bonded to the power-supplied member by hot-pressing, said bonding member having the shape of a disc or a ball and comprising niobium;
   a terminal bonded to the power-supplied member through the bonding member, wherein a difference in coefficient of thermal expansion between the bonding member and the sintered body is $2\times10^{-6}$/K or less, a melting point of the bonding member is higher than a baking temperature of the sintered body, and a portion of the base positioned below the power-supplied member and at a periphery of the bonding member contains 1.4-1.5 wt % carbon.

2. The alumina member according to claim 1, wherein a tensile strength of the base at a breaking point thereof is 1.0 kg weight/mm$^2$ or more when a load to pull the base and the terminal in directions separating from each other is applied thereto.

3. The alumina member according to claim 1, wherein a punching load to the base at the breaking point thereof is 30 kg weight or more when a load is applied thereto in a direction from the terminal toward the bonding member.

4. The alumina member according to claim 1, wherein the bonding member and the terminal are bonded to each other by at least one of indium, gold, silver, an aluminum-alumina composite material, and a gold-nickel alloy.

5. A method of manufacturing an alumina member, comprising the steps of:
   preparing a compact comprising alumina, a carbon source, a power-supplied member and a bonding member, the carbon source being arranged below the power-supplied member and at a periphery of the bonding member; and
   hot pressing the compact to integrate the alumina, power-supplied member and bonding member to one another to form a sintered body,
   wherein an amount of the carbon source and conditions of the hot-pressing are selected such that 1.4-1.5 wt % carbon is present in the sintered body below the power-supplied member and at the periphery of the bonding member,
   wherein a difference in coefficient of thermal expansion between the bonding member and the sintered body is $2\times10^{-6}$/K or less, and
   wherein a melting point of the bonding member is higher than a temperature of the hot pressing step.

6. The method of manufacturing an alumina member according to claim 5, wherein the bonding member is coated with carbon or a carbon source.

7. The method of manufacturing an alumina member according to claim 5, wherein the bonding member comprises niobium.

* * * * *